United States Patent
Ogden et al.

(10) Patent No.: US 10,317,624 B1
(45) Date of Patent: Jun. 11, 2019

(54) MONOLITHIC COLLIMATOR ARRAY

(71) Applicant: Lockheed Martin Corporation, Bethesda, MD (US)

(72) Inventors: Chad E. Ogden, Half Moon Bay, CA (US); Guy Chriqui, San Mateo, CA (US)

(73) Assignee: Lockheed Martin Coporation, Bethesda, MD (US)

( * ) Notice: Subject to any disclaimer, the term of this patent is extended or adjusted under 35 U.S.C. 154(b) by 0 days.

(21) Appl. No.: 15/875,939

(22) Filed: Jan. 19, 2018

Related U.S. Application Data

(60) Provisional application No. 62/448,331, filed on Jan. 19, 2017.

(51) Int. Cl.
  *G02B 6/12* (2006.01)
  *G02B 6/26* (2006.01)
  *G02B 6/122* (2006.01)
  *H01L 27/146* (2006.01)

(52) U.S. Cl.
  CPC ............ *G02B 6/262* (2013.01); *G02B 6/122* (2013.01); *G02B 2006/12102* (2013.01); *H01L 27/14625* (2013.01); *H01L 27/14634* (2013.01); *H01L 27/14685* (2013.01)

(58) Field of Classification Search
  CPC ................... G02B 6/262; G02B 2006/12102
  See application file for complete search history.

(56) References Cited

U.S. PATENT DOCUMENTS

| | | | |
|---|---|---|---|
| 6,722,792 B2* | 4/2004 | Raj | G02B 6/12004 |
| | | | 385/30 |
| 8,923,670 B2* | 12/2014 | Zbinden | G02B 6/4214 |
| | | | 385/33 |
| 9,754,985 B1 | 9/2017 | Duncan et al. | |
| 2006/0141649 A1 | 6/2006 | Joyner et al. | |
| 2014/0086527 A1* | 3/2014 | Ban | G02B 6/30 |
| | | | 385/33 |

* cited by examiner

*Primary Examiner* — Omar R Rojas
(74) *Attorney, Agent, or Firm* — Morgan, Lewis & Bockius LLP

(57) ABSTRACT

A method of manufacturing a monolithic array of lenslets that inject light into waveguides without the need for alignment of a separate lenslet array and waveguide array is provided. The waveguide array may be incorporated as a monolithic or fused piece with the substrate on which the lenslet array is to be written. A method of producing a flat, thin monolithic collimator array having a form corresponding to that of a PIC, with the input/output lenslet array located on the top surface of the collimator array is provided. A method for bonding a two-dimensional (2-D) array of lenslets on top of a photonic integrated circuit (PIC) substrate with a small gap for thermal expansion between lenslet blocks is provided.

13 Claims, 8 Drawing Sheets

MONOLITHIC COLLIMATOR ARRAY

CROSS-REFERENCES TO RELATED APPLICATION

This application claims the benefit of U.S. Provisional Application No. 62/448,331, entitled "MONOLITHIC COLLIMATOR ARRAY," filed Jan. 19, 2017, the entirety of which is incorporated herein by reference.

STATEMENT REGARDING FEDERALLY SPONSORED RESEARCH OR DEVELOPMENT

Not applicable.

TECHNICAL FIELD

The present description relates in general to imaging devices and methods of manufacture, and in particular to, for example, without limitation, monolithic collimator arrays for photonic integrated circuits (PICs).

BACKGROUND OF THE DISCLOSURE

Traditional electro-optical imaging payloads include an optical telescope to collect the light from the object scene and map the photons to an image plane to be digitized by a focal plane detector array. The size, weight, and power (SWaP) for the traditional imager is dominated by the optical telescope, driven primarily by the large optics, large stiff structures, and the thermal control needed to maintain precision free-space optical alignments. These factors drive the cost, which scales in relation to the optical telescope aperture radius.

Imaging systems can include lens devices providing an array of lenslets and other devices for receiving light directed from the lenslets. Lenslet arrays can be coupled to a collimator array, a waveguide device, or a photonic integrated circuit (PIC). Conventional methods of coupling generally include coupling together two large, separate bodies (substrates) with differing coefficients of thermal expansion (CTEs). Such methods generally require a step of aligning the lenslet arrays and the collimator arrays to each other with a high degree of precision. Some methods of directing light can involve a chip interconnect made by angle-polishing an edge of the chip to make an internal fold mirror. Conventional inferometric imaging devices generally include multiple PIC imager assemblies that require long hours of labor to mechanically align substrates of the various assemblies.

The description provided in the background section should not be assumed to be prior art merely because it is mentioned in or associated with the background section. The background section may include information that describes one or more aspects of the subject technology.

BRIEF SUMMARY OF THE DISCLOSURE

Methods and devices of the present disclosure can be utilized to provide an array of lenslets that inject light into waveguides without the need for alignment of separate lenslet arrays and waveguide arrays.

Various examples of aspects of the disclosure are described below as clauses for convenience. These are provided as examples, and do not limit the subject technology.

Clause A. An imaging device comprising a waveguide device; and a lens substrate fused to the waveguide device and comprising a first surface coupled to the waveguide device; a second surface forming multiple lenslets; and a boundary surface for reflecting light within the substrate and from each of the lenslets to a corresponding portion of the waveguide device.

Clause B. A method of manufacturing an imaging device, the method comprising fusing a first surface of a lens substrate to a waveguide device, illuminating an optical fiber of the waveguide device to transmit light through the lens substrate and provide a fiducial indicator at a second surface of the lens substrate; and forming a lenslet on the second surface of the lens substrate corresponding to a location of the fiducial indicator.

Clause C. An imaging device comprising a monolithic waveguide substrate; and multiple lens blocks fused to the waveguide substrate and separated from each other, wherein each of the lens blocks forms a lenslet for transmitting light through the lens block to the waveguide substrate.

Clause D. A method of manufacturing an imaging device, the method comprising cutting a lens substrate from a first surface of the lens substrate partially toward a second surface of the lens substrate, fusing the first surface of the lens substrate to a waveguide substrate; and cutting the lens substrate from the second surface toward the first surface to form lens blocks fused to the waveguide substrate and separated from each other.

Each of embodiments A, B, C, and D may have one or more of the following additional elements in any combination:

Element 1: each lenslet has a common focal length and a distance from each of the lenslets to the corresponding portion of the waveguide device is equal.

Element 2: the waveguide device comprises an array of photonic integrated circuit (PIC) devices arranged in multiple layers that are parallel to each other and transverse to a direction of the lenslets.

Element 3: the lenslets are arranged in a common plane.

Element 4: the lens substrate has a coefficient of thermal expansion that is different than a coefficient of thermal expansion of the waveguide device.

Element 5: the waveguide device comprises optical fibers.

Element 6: the waveguide device comprises a photonic integrated circuit (PIC).

Element 7: illuminating the optical fiber of the waveguide device comprises transmitting the light from the first surface to the second surface by reflecting the light at a boundary surface of the lens substrate.

Element 8: illuminating additional optical fibers of the waveguide device to provide additional fiducial indicators at the second surface of the lens substrate; and forming additional lenslets on the second surface of the lens substrate corresponding to the location of the additional fiducial indicators, wherein each lenslet is formed with a common focal length and a distance from each of the lenslets to a corresponding waveguide is equal.

Element 9: the waveguide device comprises a support housing the optical fiber, wherein the support and the lens substrate are of different materials.

Element 10: the waveguide substrate comprises boundary surfaces, opposite the lens blocks, for reflecting light from the lenslets to a corresponding waveguide device.

Element 11: each of the lens blocks has a coefficient of thermal expansion that is different than a coefficient of thermal expansion of the waveguide substrate.

Element 12: each of the lens blocks is arranged on a planar surface of the waveguide substrate.

Element 13: each of the lenslets provides a common focal length.

Element 14: after the fusing, forming lenslets on the second surface of the lens substrate.

Element 15: before the fusing, aligning lenslets on the second surface of the lens substrate with respect to the waveguide substrate.

Element 16: each of the lens blocks is arranged on a planar surface of the waveguide substrate.

Element 17: each of the lens blocks forms a corresponding one of multiple lenslets opposite the waveguide substrate, the lenslets being arranged in a common plane.

The description in this summary section may provide some illustrative examples of the disclosure. This section is not intended to be a broad overview or to identify essential elements of the disclosure.

Figure 1:
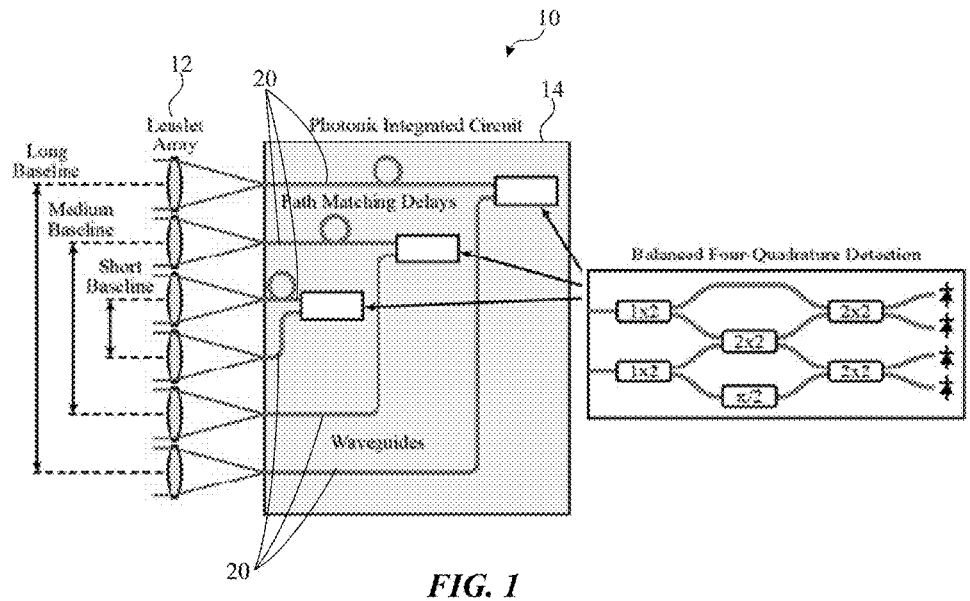
FIG. 1 illustrates a block diagram of an exemplary imaging system.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Optical imaging devices and methods of manufacture are described herein. Such devices and methods can incorporate aspects of interferometer imaging techniques. Imaging systems can utilize phased optical arrays with two-dimensional surfaces, thereby enabling the construction of flat-panel optical systems. Such systems have a lower cost profile based on size, weight, and power (SWaP) scaling of $R^2$ instead of $R^3$.

Some conventional methods of manufacturing imaging devices generally include manufacturing lenslet arrays and collimator arrays, then performing an additional step of precisely aligning the lenslet arrays and the collimator arrays to each other to fix the lenslet and collimator arrays into a bonded structure. However, the aforementioned methods are tedious, expensive, and often result in product that is not thermally stable. Lenslets must be aligned to sub-micron accuracies for good coupling into waveguides on a PIC. Thermal expansion and mechanical stability issues can easily cause the lenslets to become misaligned resulting in lost injection of light. The design of an athermal structure to hold the lenslets and waveguides is both difficult and time consuming, as is their alignment and bonding.

Some conventional methods of bonding two-dimensional (2-D) lenslet arrays with PIC substrates generally include bonding together two large, monolithic bodies (substrates) with differing coefficients of thermal expansion (CTEs). The aforementioned conventional configuration suffers from innate limitations on thermal range, which are a product of the bonding of the two substrates having the differing CTEs. For example, the different coefficients of thermal expansion may not match, and as a result, as the temperature of at least one of the substrates changes, stresses develop in the bond between the two substrates that could cause optical misalignment. In some cases, these stresses may even become high enough to damage one of the substrates.

Other conventional chip interconnects are typically made by angle-polishing an edge of the chip to make an internal fold mirror to direct light. However, the aforementioned configuration does not provide the capability of providing a continuity between a substrate for lenslets and a substrate for a waveguide and/or PIC device. Because only certain substrates (e.g., silica) are conducive to certain lenslet writing processes, it is desirable to transmit light from a lens substrate to a waveguide and/or PIC device.

Methods and devices of the present disclosure can be utilized to provide an array of lenslets that inject light into waveguides without the need for alignment of separate lenslet arrays and waveguide arrays.

An optical imaging system can include one or more interferometers. For example, such a system can include multiple interferometers arranged in a preset pattern. FIG. 1 illustrates a diagram of a one-dimensional array 10 of interferometers. The interferometers can comprise a Michelson interferometer. As shown, pairs of lenslets 12 can be combined to form interference fringes or three interferometer baselines. In accordance with some embodiments, each pair of lenslets 12 can provide phase and amplitude for one point in the image u-v frequency plane.

The lenslets 12 can be coupled to a waveguide embedded into a circuit or microchip, such as photonic integrated circuit (PIC) 14. In one or more examples, the PIC 14 can include path-matching delays and arrayed waveguide gratings for multiple spectral channels 20. The path matching delays can be used to equalize the path lengths between lenslets 12. Further, balanced four quadrature detectors can be used to measure amplitude and phase for each spectral channel. The spectral channels are not illustrated in the figure, but can be placed prior to the path matching delays. Alternatively or in combination, the PIC 14 can include one or more waveguides, filters, couplers, equalizers, modulators, detectors, and/or converters.

Figure 2:
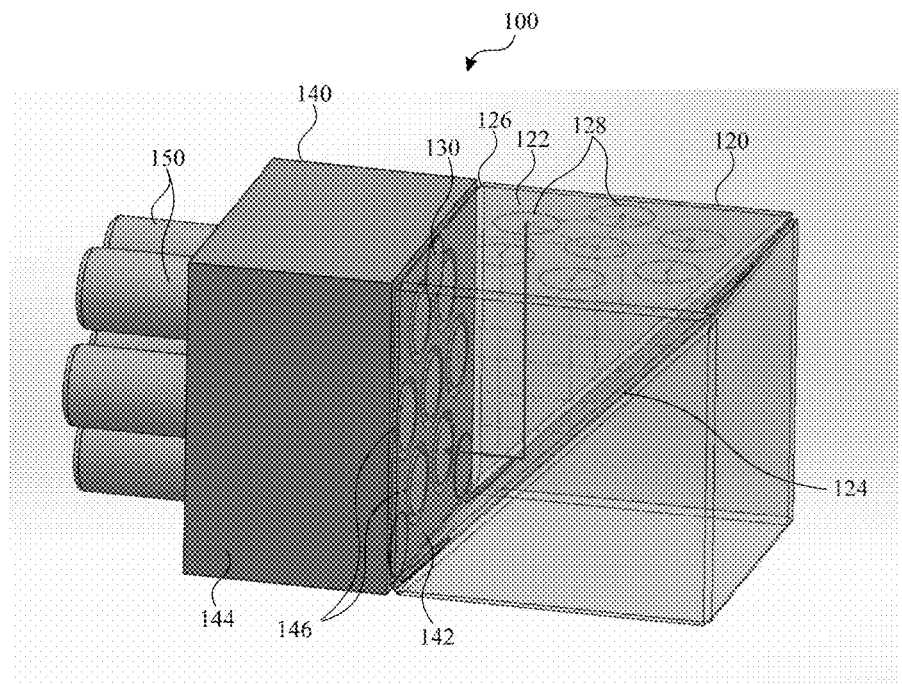
FIG. 2 illustrates a perspective view of an exemplary imaging device.

FIG. 2 illustrates an imaging device 100 that includes a lens substrate 120 and a waveguide device 140. The waveguide device 140 can include a waveguide substrate 144 that supports one or more waveguides 150 extending through corresponding channels 146 of the waveguide substrate 144.

The lens substrate 120 is fused to the waveguide device 140 to maintain a fixed relative position thereto. The lens substrate 120 and the waveguide device 140 can be fused together to form a monolithic structure. For example, a first surface 126 of the lens substrate 120 can be fused to an interface surface 142 of a waveguide substrate 144 of the waveguide device 140. The fusion can be in discrete regions 130 or across entireties of the first surface 126 and/or the interface surface 142.

The ability to fuse the lens substrate 120 and the waveguide device 140 is facilitated by the subsequent formation of lenslets 128 on a second surface 122 of the lens substrate 120. The lenslets 128 can be positioned within a common plane. Each lenslet 128 can be formed with a common focal length and a distance from each of the lenslets 128 to the corresponding waveguide 150 being equal. The lenslets 128 can each be configured to direct light incident on the second surface 122 to a corresponding one of multiple waveguides 150. The lens substrate 120 can include a boundary surface 124 for reflecting within the lens substrate 120 (i.e., by total internal reflection). For example, the boundary surface 124 can reflect light transmitted from the lenslets 128 to corresponding waveguides 150 of the waveguide device 140. By further example, where the waveguides 150 are oriented in a direction that is orthogonal to an orientation of the lenslets 128, the boundary surface 124 can form an angle of 45° with each of the first surface 126 and the second surface 122 to reflect the light at a right angle. It will be recognized that other angles can be used to reflect light transmitted from the lenslets 128 to corresponding waveguides 150 of the waveguide device 140.

Accordingly, the lens substrate can act as a prism to direct light from the lenslets to the waveguides. This provides an ability to transmit light from a lens substrate that is conducive to lenslet writing to a waveguide and/or a PIC device. The lens substrate also allows the transmission of light that is incident on a top surface to a waveguide and/or a PIC device that is oriented in a transverse (e.g., orthogonal) direction with respect to the direction of incident light. This further enables the construction of a flat, thin monolithic collimator array, such as the form factor of a PIC device, with the lenslet array located on the top surface.

Figure 3:
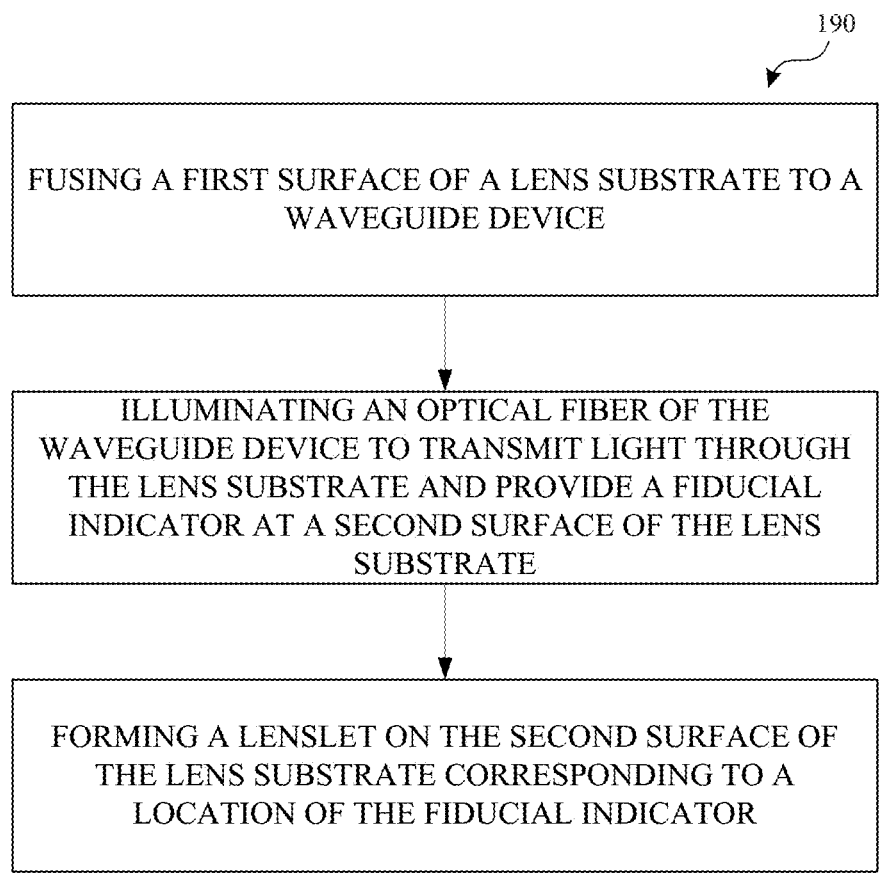
FIG. 3 illustrates a flowchart of an exemplary method for manufacturing an imaging device.

A method of manufacturing the imaging device 100 allows the lenslets to be formed in an accurate alignment with the waveguides 150. FIG. 3 illustrates a flowchart of an exemplary method 190. As shown, the first surface 126 of the lens substrate 120 can be fused to the interface surface 142 of the waveguide substrate 144 of the waveguide device 140. Next, one or more of the waveguides 150 (e.g., optical fibers), is illuminated to transmit light through the lens substrate 120. For example, light can be transmitted from the first surface 126, off the boundary surface 124, and to the second surface 122 where it provides a fiducial indicator. Based on the location of the fiducial indicator, a lenslet 128 is formed on the second surface 122. The lenslet 128 can be formed by writing technologies that are operable on the lens substrate 120. For example, the lens substrate 120 can be of silica (SiO2). The lenslet 128 can be formed by a laser or other device into the face of the substrate.

Because the lenslets are formed after the fusion step, the lenslets are not susceptible to the conditions of the fusion process. Additionally, because the lenslets are formed after fusion, positioning thereof is based on the actual location needed to transmit light from the lenslets to the waveguides, as indicated by the fiducial indicators. Accordingly, the aforementioned configuration yields a monolithic, pre-aligned collimator array, eliminates the tedious process of manual alignment of separate lenslet and waveguide arrays, and provides a product with improved thermal stability, as compared to conventional collimator arrays.

Figure 4:
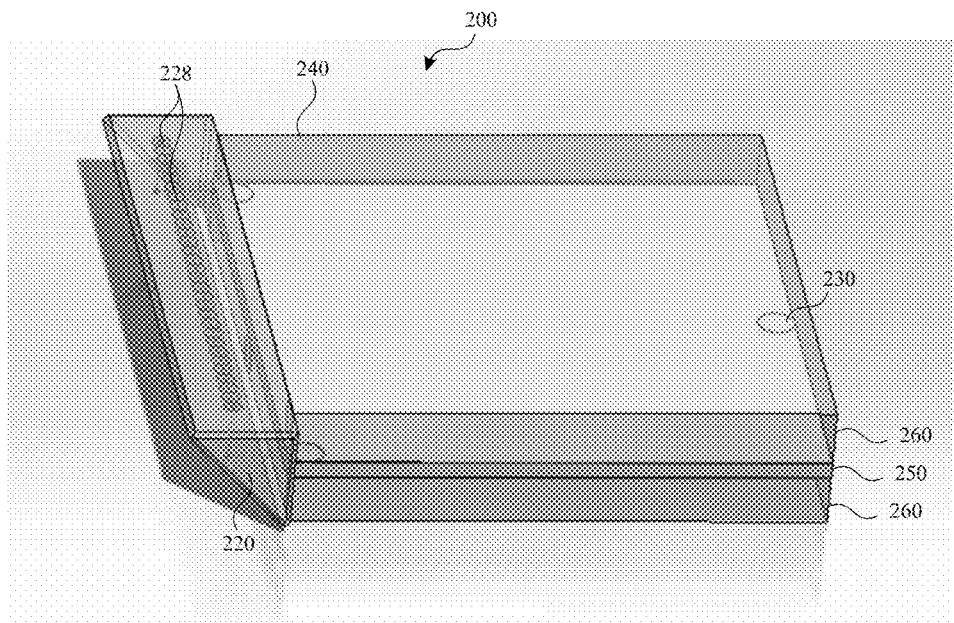
FIG. 4 illustrates a perspective view of an exemplary imaging device.
Figure 5:
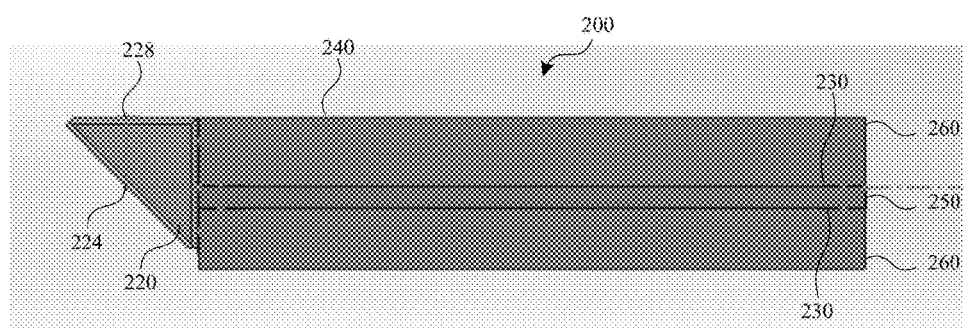
FIG. 5 illustrates a side view of the imaging device of FIG. 4.

Methods and devices of the present disclosure can be utilized to provide an array of lenslets that inject light into PIC devices that can be configured in one or more layers. FIGS. 4 and 5 illustrate an imaging device 200 that includes a lens substrate 220 and a waveguide device 240. The waveguide device 240 can include a PIC layer 250 and one or more spacer layers 260, which can be of the same material as the PIC layer 250. The PIC layer 250 can be separated from the one or more spacer layers 260 by one or more pads 230, which can also provide bonding between the PIC layer 250 and the one or more spacer layers 260.

The lens substrate 220 is fused to the waveguide device 240 (e.g., one or more spacer layers 260) to maintain a fixed relative position thereto. A method of manufacture can be employed in a manner similar to that of the imaging device 100. For example, the lens substrate 220 and the waveguide device 240 (e.g., PIC layer 250 and/or spacer layers 260) can be fused together to form a monolithic structure. The lenslets 228 can be positioned within a common plane. Each lenslet 228 can be formed with a common focal length and a distance from each of the lenslets 228 to the PIC layer 250 being equal. The lenslets 228 can each be configured to direct light to a corresponding portion of the PIC layer 250. As such, multiple lenslets 228 can be aligned with a single PIC layer 250. The lenslets 228 corresponding to a given PIC layer 250 can be arranged in a single row. The lens substrate 220 can include a boundary surface 224 for reflecting within the lens substrate 220 (i.e., by total internal reflection). For example, the boundary surface 224 can reflect light transmitted from the lenslets 228 to the PIC layer 250 of the waveguide device 240. By further example, where the PIC layer 250 is in a plane that is orthogonal to an orientation of the lenslets 228, the boundary surface 224 can form an angle of 45° to reflect the light at a right angle. It will be recognized that other angles can be used to reflect light transmitted from the lenslets 228 to the PIC layer 250 of the waveguide device 240.

Each PIC layer 250 can include one or more PIC devices that receive light from the lenslets 228. The PIC devices can be optionally spaced apart from lens substrate 220 along a longitudinal axis thereof. In accordance with some embodiments, the PIC devices can process the light directed thereto from the lenslets 228. For example, the PIC devices can each collect light into a two-dimensional array of waveguides. Thereafter, the light can be demultiplexed into several spectral bins. Further, a phase shift can be applied to the light. Additionally, the light can be coherently combined into baseline pairs. In some embodiments, the combining can also comprise accounting for separation differences between lenslets. Furthermore, the PIC devices can also be configured to perform photo detection of complex fringe patterns.

Various material platforms can be used for performing optical processing operations with integrated photonic devices. Such materials can comprise, e.g., indium phosphide (InP), silicon (Si), silica (SiO2), silicon oxynitride (SiOxNy), and other suitable materials. The material(s) of the PIC layers 250 can be in part or entirely the same or different than the material(s) of the lens substrate 220. Furthermore, their respective fabrication processes can use CMOS-compatible fabrication equipment, which can provide a direct path to large-scale photonic integration.

Figure 6:
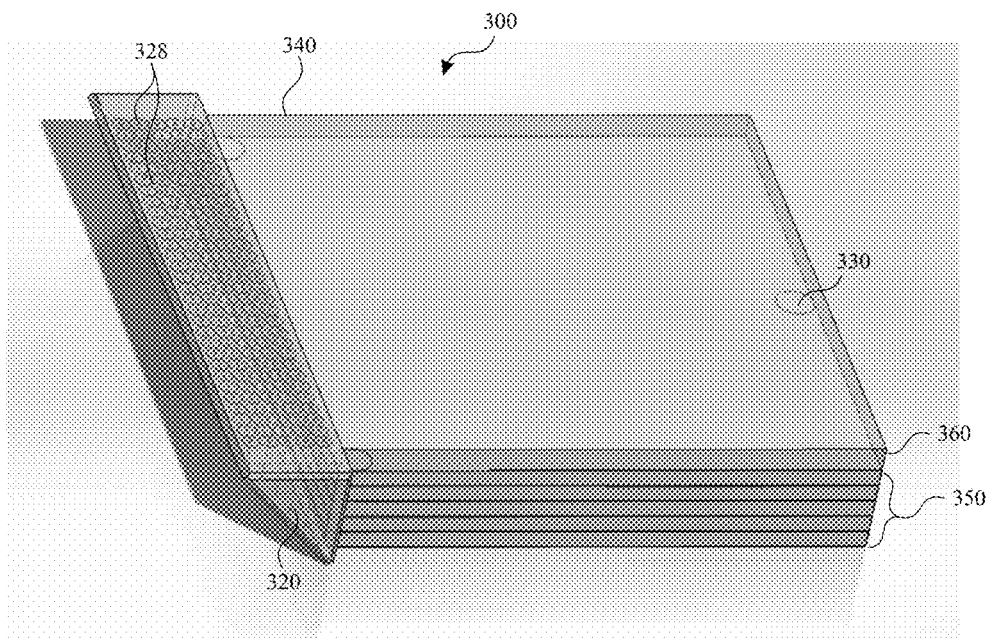
FIG. 6 illustrates a perspective view of an exemplary imaging device.
Figure 7:
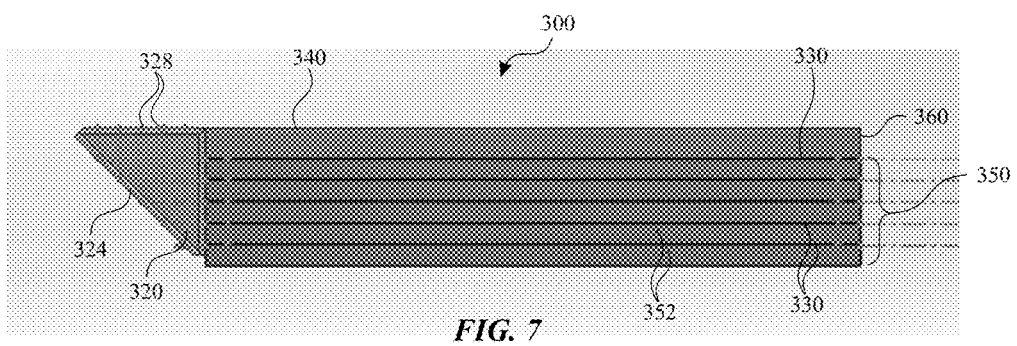
FIG. 7 illustrates a side view of the imaging device of FIG. 6.

FIGS. 6 and 7 illustrate an imaging device 300 that includes a lens substrate 320 and a waveguide device 340. The waveguide device 340 can include PIC layers 350 and one or more spacer layers 360, which can be of the same material as the PIC layers 350. The PIC layers 350 can be separated from the one or more spacer layers 360 by one or more pads 330, which can also provide bonding between the PIC layers 350 and the one or more spacer layers 360.

The lens substrate 320 is fused to the waveguide device 340 (e.g., one or more spacer layers 360) to maintain a fixed relative position thereto. A method of manufacture can be employed in a manner similar to that of the imaging device 100. For example, the lens substrate 320 and the waveguide device 340 (e.g., PIC layers 350 and/or spacer layers 360) can be fused together to form a monolithic structure. The lenslets 328 can be positioned within a common plane. Each lenslet 328 can be formed with a common focal length and a distance from each of the lenslets 328 to a corresponding PIC layer 350 being equal. The lenslets 328 can each be configured to direct light to a corresponding portion of the PIC layers 350. As such, multiple lenslets 328 can be aligned with each of the PIC layers 350. The lenslets 328 corresponding to a given PIC layer 350 can be arranged in a single row, with other rows corresponding to other PIC layers 350. The lens substrate 320 can include a boundary surface 324 for reflecting within the lens substrate 320 (i.e., by total internal reflection). For example, the boundary surface 324 can reflect light transmitted from the lenslets 328 to the PIC layers 350 of the waveguide device 340. By further example, where the PIC layers 350 are in parallel planes that are orthogonal to an orientation of the lenslets 328, the boundary surface 324 can form an angle of 45° to reflect the light at a right angle. It will be recognized that other angles can be used to reflect light transmitted from the lenslets 328 to the PIC layers 350 of the waveguide device 340. As discussed above, this enables the construction of a flat, thin monolithic collimator array, including multiple PIC layers, with the lenslet array located on the top surface.

Figure 8:
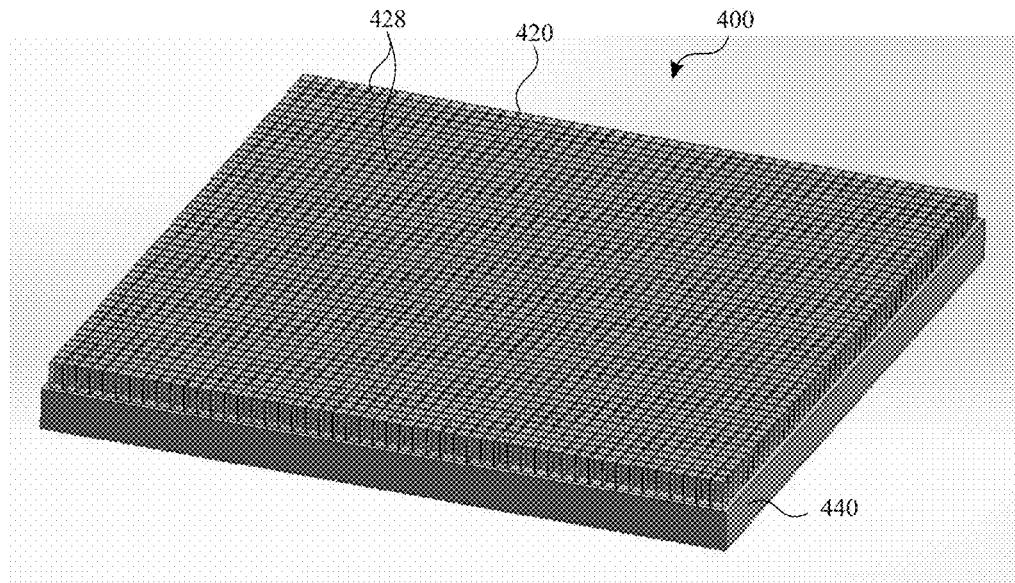
FIG. 8 illustrates a perspective view of an exemplary imaging device.
Figure 9:
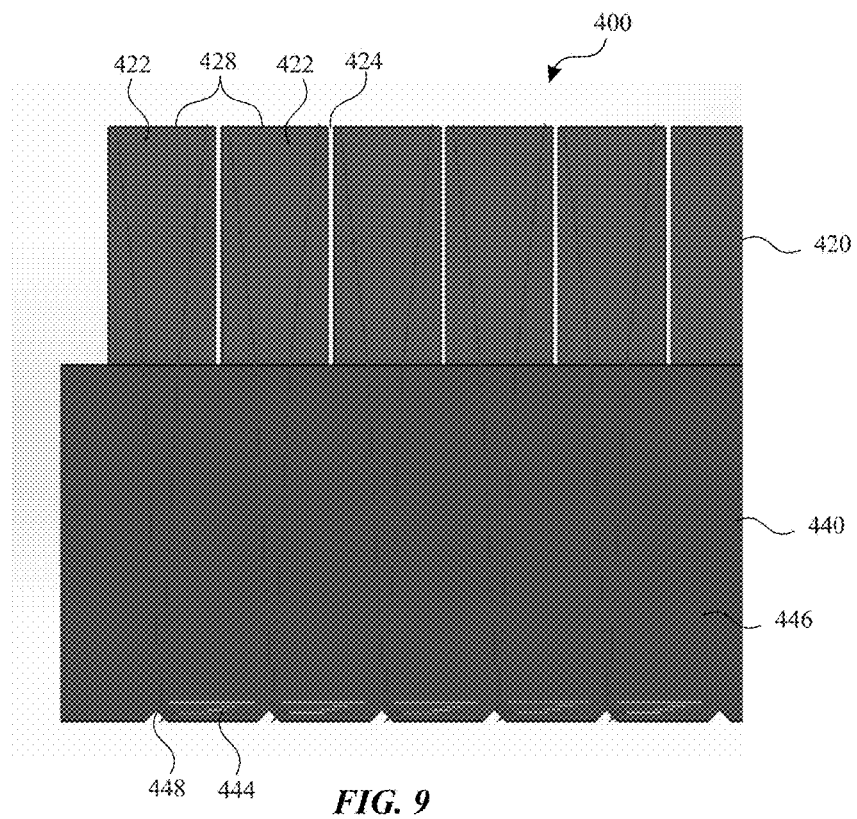
FIG. 9 illustrates a side view of the imaging device of FIG. 8.

Methods and devices of the present disclosure can be utilized to provide a two-dimensional (2-D) array of lens blocks on top of a waveguide device with a small gap for thermal expansion between lens blocks to reduce the undesirable effects of differential thermal expansion between the lens blocks and waveguide device. FIGS. 8 and 9 illustrate an imaging device 400 that includes a lens substrate 420 and a waveguide device 440.

The lens substrate 420 is divided into multiple lens blocks 422. Each lens block 422 can include a lenslet 428 on a surface opposite the waveguide device 440. The lenslets 428 can be positioned within a common plane.

The waveguide device 440 can include a waveguide substrate 446 that supports one or more waveguides 444 and/or PIC devices. The waveguide device 440 can include a boundary surface 448 for reflecting within the waveguide device 440 (i.e., by total internal reflection). For example, the boundary surface 448 can reflect light transmitted from the lenslets 428 to the waveguides 444 and/or PIC devices of the waveguide device 440. As shown in FIG. 9, the boundary surfaces 448 can be formed into a surface of the waveguide substrate 446 that is opposite the lens blocks 422. By further example, the boundary surface 448 can form an angle of 45° to reflect the light at a right angle. It will be recognized that other angles can be used to reflect light transmitted from the lenslets 428 to the waveguides 444 and/or PIC devices of the waveguide device 440. Each lenslet 428 can be formed with a common focal length and a distance from each of the lenslets 428 to the corresponding waveguide 444 being equal.

The lens substrate 420 is divided into multiple lens blocks 422 that are each fused to the waveguide device 440 to maintain a fixed relative position thereto. For example, the lens blocks 422 and the waveguide device 440 can be fused together to form a monolithic structure. Because the CTE of the lens blocks 422 may not match the CTE of the waveguide substrate 446, as the PIC temperature changes, stresses develop in the bond between the two substrates that would threaten optical misalignment and/or damage either of the substrates. As described above, various aspects of the present disclosure disclosed herein provide a solution to the aforementioned thermal instability associated with the differing CTEs of the substrates by applying lenslet writing technologies that utilize fused silica as the lenslet array substrate, and providing expansion gaps between individual lenslets to overcome the innate limitations on thermal range which are a product of bonding together two large, monolithic bodies with differing CTEs.

Figure 10:
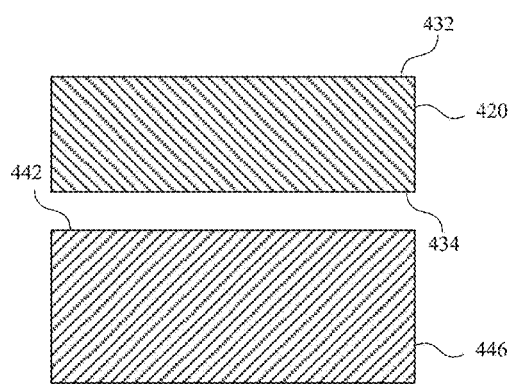
FIG. 10 illustrates a sectional view of an exemplary imaging device in a first stage of manufacture.
Figure 11:
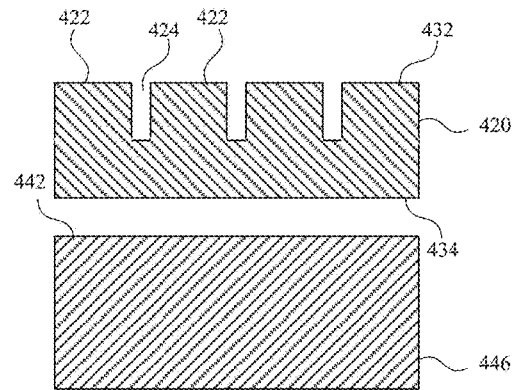
FIG. 11 illustrates a sectional view of the imaging device of FIG. 10 in another stage of manufacture.

FIGS. 10-13 illustrate stages of a method of manufacturing the imaging device 400. As shown in FIG. 10, a lens substrate 420 is provided as a single, unitary component. The lens substrate 420 includes a first surface 432 and a second surface 434, opposite the first surface 432. As shown in FIG. 11, the lens substrate 420 is cut from the first surface 432 partially toward the second surface 434. The cutting forms a portion of gaps 424 that extend from the first surface 432 toward, but not to, the second surface 434. Accordingly, the lens substrate 420 remains as a single, unitary component. The cut can be in a pattern that partially separates each lens block 422 from adjacent lens blocks 422. For example, for a square-pack lenslet array, the cutting can be accomplished using a cutting mechanism, e.g., a dicing saw, to form a grid of cuts that do not penetrate all the way through the lens substrate 420.

Figure 12:
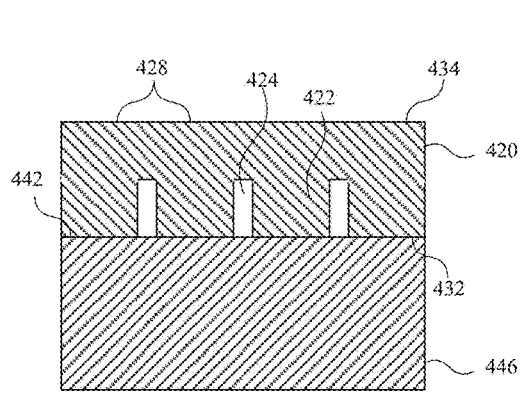
FIG. 12 illustrates a sectional view of the imaging device of FIGS. 10 and 11 in another stage of manufacture.
Figure 13:
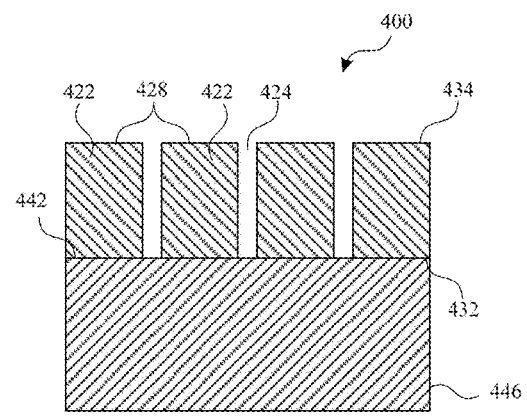
FIG. 13 illustrates a sectional view of the imaging device of FIGS. 10-12 in another stage of manufacture.

As shown in FIG. 12, the lens substrate 420 can be inverted to position the first surface 432 against a planar interface surface 442 of the waveguide substrate 446. The lens blocks 422 defining the first surface 432 can each be fused to the waveguide substrate 446. As shown in FIG. 13, after the fusion is complete, the lens substrate 420 may be cut again and from the second surface 434 toward the first surface 432 to form the lens blocks 422 as fully separated from each other. For example, the second cut can be along the same lines as the first cut. The gaps 424 can then extend entirely from the first surface 432 to the second surface 434.

Figure 14:
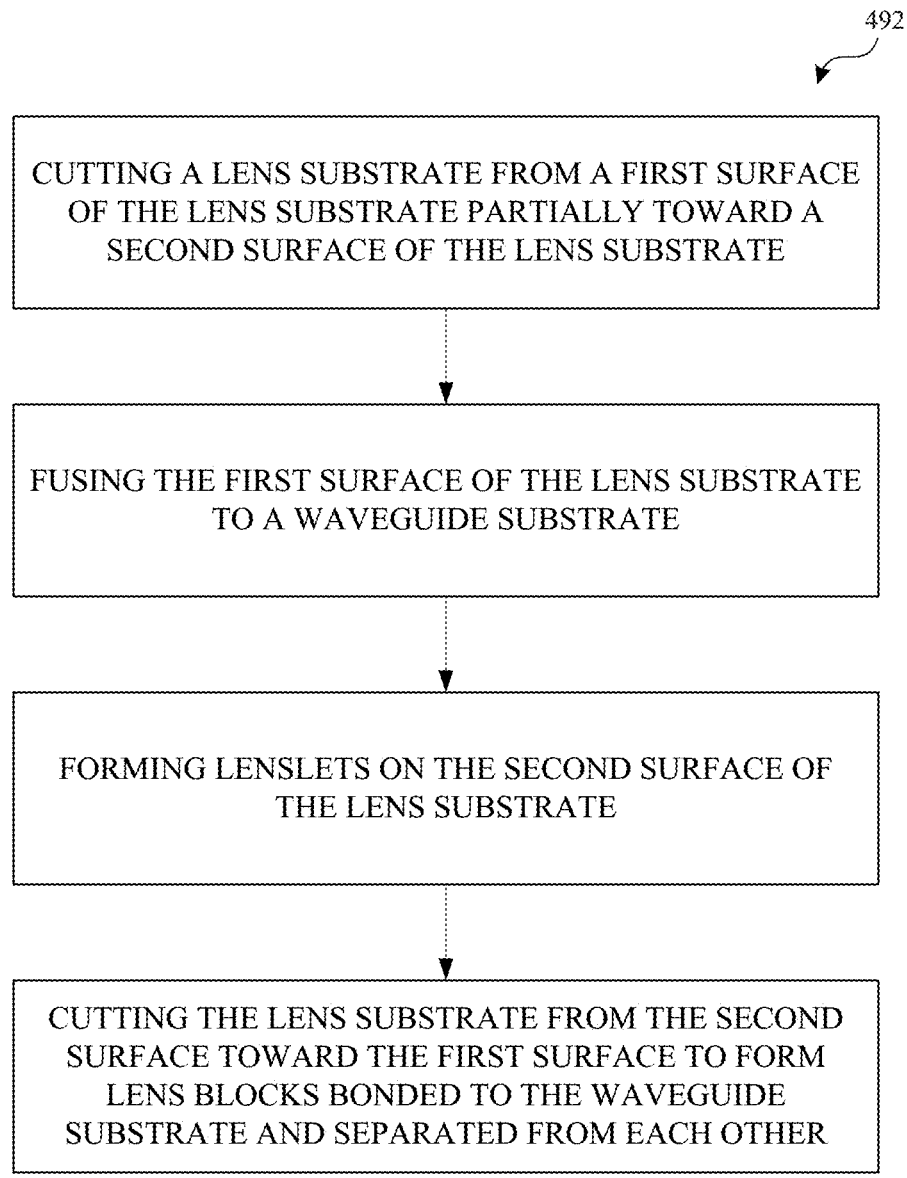
FIG. 14 illustrates a flowchart of an exemplary method for manufacturing an imaging device.

The method described above can be modified based on how the lenslets are to be provided. For example, the lenslets may not be present on the substrate during the formation of the cuts, but may instead be machined onto the substrate after the cutting is complete. The machining of the lenslets onto the substrate can occur after the bonding of the partially-diced grid of lens blocks to the interface surface of the waveguide substrate and the repeat cutting of the lenslet substrate. For example, the lenslets 428 can be formed after fusing the lens substrate 420 to the waveguide device. FIG. 14 illustrates a flowchart of an exemplary method 492. As shown, the first surface 432 of the lens substrate 420 can be cut, and the first surface can be fused to the waveguide substrate 446. Next, one or more of the waveguides 444 (e.g., optical fibers), is illuminated to transmit light through the waveguide substrate 446 and the lens substrate 420. For example, light can be transmitted off the boundary surface 448 and to the second surface 434 of the lens substrate 420, where it provides a fiducial indicator. Based on the location of the fiducial indicator, a lenslet 428 is formed on the second surface 434. The second surface 434 can be cut to fully form and separate the lens blocks 422 before or after forming the lenslets 428.

Figure 15:
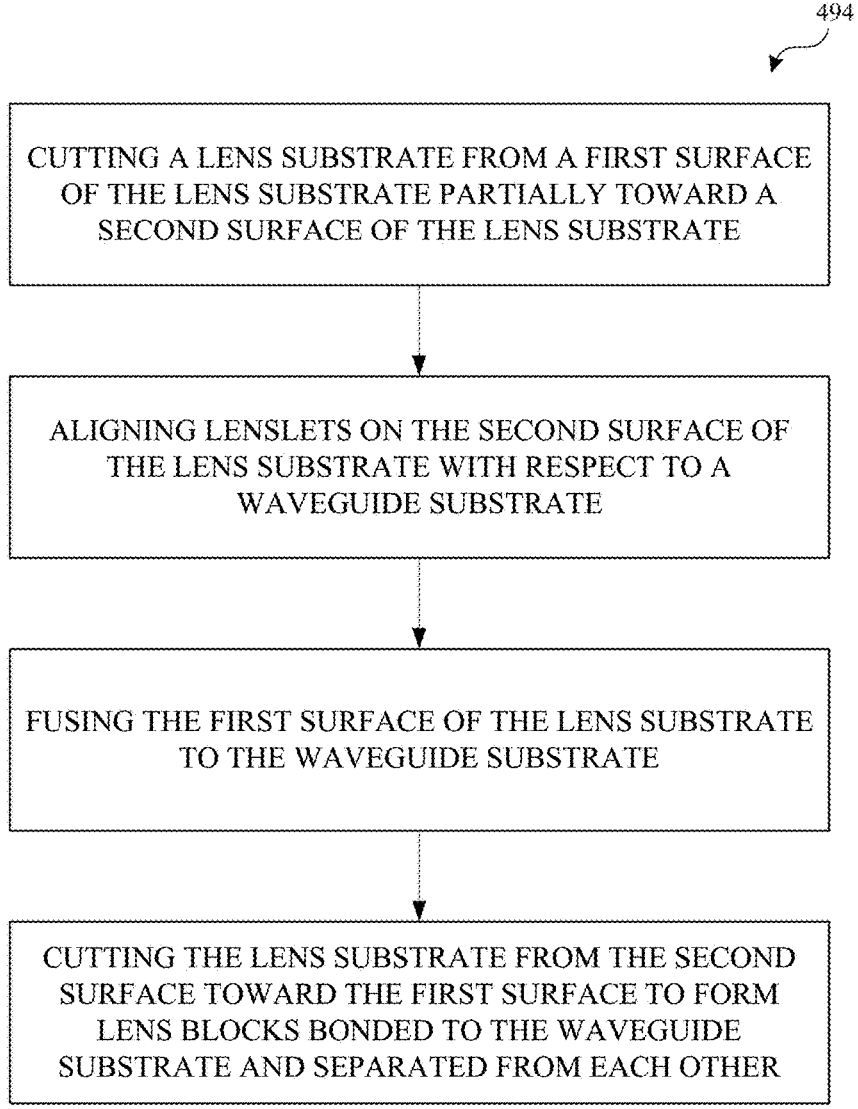
FIG. 15 illustrates a flowchart of an exemplary method for manufacturing an imaging device.

The method described above can be modified to accommodate existing lenslets. For example, the lenslets 428 can be formed prior to fusing the substrates. FIG. 15 illustrates a flowchart of another exemplary method 494. As shown, the first surface 432 of the lens substrate 420 can be cut. Before cutting the second surface 434 and fully separating the lens blocks 422, the lenslets 428 can be aligned with respect to the lens substrate 420 (e.g., the boundary surface 448 and/or the waveguides 444). Thereafter, the first surface 432 can be fused to the waveguide substrate 446, and the second surface 434 can be cut to fully form and separate the lens blocks 422.

The result is a 2-D array of lenslets on top of the PIC substrate, where each lenslet sits on its own independent block of lenslet substrate, with a small gap for thermal expansion between lenslet blocks. The aforementioned configuration reduces the undesirable effects of differential thermal expansion between the two substrates as the substrate blocks sit tightly packed, but not touching each other.

As disclosed herein, some embodiments provide systems that can utilize nanophotonics and MEMs technology to provide applications that involve collecting photons from external sources and processing them on a PIC card to form computational images rather than the traditional approach that directly forms an image on a digital focal plane with a large, bulky optical telescope. As such, some embodiments present an exciting and revolutionary advancements in the field that can have substantial impact on future space-based sensors. As a further advantage, some embodiments can be implemented to provide space surveillance sensors in a cost and schedule constrained environment. Additionally, some embodiments disclosed herein provide a revolutionary electro-optical (EO) sensor that is a compact alternative to the traditional EO imaging sensor by dramatically reducing size, weight, power, schedule, and integration and test complexity through the elimination of the manufacture, polishing, and alignment of the large optics required by conventional EO sensors.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. An imaging device comprising:
    a monolithic waveguide substrate; and
    multiple lens blocks fused to the waveguide substrate on first surfaces of the lens blocks, the lens blocks being separated from each other in a grid pattern forming multiple rows of the lens blocks, wherein the lens blocks extend away from a surface of the monolithic waveguide substrate with side surfaces that are perpendicular to the surface of the monolithic waveguide substrate and each of the lens blocks forms a lenslet on second surfaces of the lens blocks for transmitting light through the lens block to the waveguide substrate, the second surfaces facing away from the waveguide substrate.

2. The imaging device of claim 1, wherein the waveguide substrate comprises boundary surfaces, opposite the lens blocks, for reflecting light from the lenslets to a corresponding waveguide device.

3. The imaging device of claim 1, wherein each of the lens blocks has a coefficient of thermal expansion that is different than a coefficient of thermal expansion of the waveguide substrate.

4. The imaging device of claim 1, wherein each of the lens blocks is arranged on a planar surface of the waveguide substrate.

5. The imaging device of claim 1, wherein the lenslets are arranged in a common plane.

6. The imaging device of claim 1, wherein each of the lenslets provides a common focal length.

7. A method of manufacturing an imaging device, the method comprising:
    cutting a lens substrate from a first surface of the lens substrate partially toward a second surface of the lens substrate;
    fusing the first surface of the lens substrate to a waveguide substrate; and
    cutting the lens substrate from the second surface toward the first surface to form lens blocks fused to the waveguide substrate and separated from each other.

8. The method of claim 7, further comprising, after the fusing, forming lenslets on the second surface of the lens substrate.

9. The method of claim 7, further comprising, before the fusing, aligning lenslets on the second surface of the lens substrate with respect to the waveguide substrate.

10. The method of claim 7, wherein each of the lens blocks has a coefficient of thermal expansion that is different than a coefficient of thermal expansion of the waveguide substrate.

11. The method of claim 7, wherein each of the lens blocks is arranged on a planar surface of the waveguide substrate.

12. The method of claim 7, wherein each of the lens blocks forms a corresponding one of multiple lenslets opposite the waveguide substrate.

13. The method of claim 12, wherein the lenslets are arranged in a common plane.

* * * * *